(12) United States Patent
Shi et al.

(10) Patent No.: US 7,196,881 B2
(45) Date of Patent: Mar. 27, 2007

(54) ADAPTIVE DOMAIN STABILIZATION FOR MAGNETIC RECORDING READ SENSORS

(75) Inventors: Changqing Shi, San Jose, CA (US); Xiaoyu Sui, Fremont, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 415 days.

(21) Appl. No.: 10/796,745

(22) Filed: Mar. 8, 2004

(65) Prior Publication Data

US 2005/0195535 A1 Sep. 8, 2005

(51) Int. Cl.
*G11B 5/39* (2006.01)

(52) U.S. Cl. .................................. 360/324.12

(58) Field of Classification Search ........... 360/324.12, 360/324.11, 324.2, 324.1, 324
See application file for complete search history.

(56) References Cited

U.S. PATENT DOCUMENTS

| | | | |
|---|---|---|---|
| 4,785,366 A | 11/1988 | Krounbi et al. | |
| 4,816,947 A * | 3/1989 | Vinal et al. | 360/321 |
| 5,155,642 A | 10/1992 | Voegeli | |
| 5,268,806 A | 12/1993 | Goubau et al. | |
| 5,325,253 A | 6/1994 | Chen et al. | |
| 5,412,518 A | 5/1995 | Christner et al. | |
| 6,195,232 B1 * | 2/2001 | Cohen | 360/126 |
| 6,201,656 B1 | 3/2001 | Go | |
| 6,275,028 B1 | 8/2001 | Matsui et al. | |
| 6,366,420 B1 | 4/2002 | Ranmuthu et al. | |
| 6,407,891 B1 * | 6/2002 | Chang et al. | 360/317 |
| 6,414,811 B1 | 7/2002 | Lee | |
| 6,429,991 B1 | 8/2002 | Tucker et al. | |
| 6,661,627 B1 * | 12/2003 | Kadokawa | 360/327.3 |
| 2003/0021070 A1 * | 1/2003 | Ohtsu et al. | 360/317 |
| 2004/0071017 A1 * | 4/2004 | Seigler et al. | 365/200 |
| 2006/0007607 A1 * | 1/2006 | Abe et al. | 360/324.12 |

FOREIGN PATENT DOCUMENTS

| | | | |
|---|---|---|---|
| GB | 2151390 A * | 7/1985 | |
| JP | 61-087215 | 5/1986 | |
| JP | 62088122 A * | 4/1987 | |
| JP | 04026907 A * | 1/1992 | |
| JP | 2003-008099 | 1/2003 | |

* cited by examiner

*Primary Examiner*—William J. Klimowicz
(74) *Attorney, Agent, or Firm*—Zilka-Kotab, PC

(57) ABSTRACT

A magnetoresistive sensor having adaptive biasing of its free layer through use of an electromagnetic biasing system incorporated into a magnetic head.

6 Claims, 8 Drawing Sheets

ADAPTIVE DOMAIN STABILIZATION FOR MAGNETIC RECORDING READ SENSORS

FIELD OF THE INVENTION

The present invention relates to magnetoresistive sensors and more particularly to the use of electromagnetic biasing of a free layer in a magnetoresistive sensor.

BACKGROUND OF THE INVENTION

A computer system requires the storage of large amounts of data. Such storage is usually provided by a magnetic disk drive that includes a magnetic disk, a slider where a magnetic head assembly including write and read heads is mounted, a suspension arm, and an actuator arm. When the magnetic disk rotates, air adjacent to the disk surface moves with the disk under the surface (ABS) of the slider, causing the slider to fly on an air bearing. The actuator arm swings the suspension arm to place the magnetic head assembly over selected circular tracks on the rotating magnetic disk, where signal fields are written and read by the write and read heads, respectively. The write and read heads are connected to processing circuitry that operates according to a computer program to implement write and read functions.

With reference to FIG. 1, an exemplary high performance read head employs a read element for sensing the signal fields from the rotating magnetic disk. The most prevalent sensor currently in use is the giant magnetoresistance GMR sensor also referred to as a spin valve. The GMR operates based on the spin dependent scattering of electrons through a conductive layer such as copper. A GMR sensor 100 includes a magnetically pinned layer 102, separated from a magnetically free layer 104 by a thin electrically conductive spacer layer 106. The pinned layer can include a pair of antiparallel pinned ferromagnetic layers 108, 110 separated by an antiparallel coupling layer 112, which can be constructed of for example Ru.

The magnetization of the pinned layer can be pinned as indicated by arrows 114, 116 by exchange coupling with an anitferrmagnetic material layer 118 such as PtMn. While antiferromagnetic materials are not magnetic in and of themselves, when exchange coupled with a ferromagnetic material, they can strongly set the magnetization of the ferromagnetic material.

The free layer 104 has a magnetization that is biased in a direction 120 parallel with an ABS surface of the slider in which it is incorporated. Although the magnetization is biased in the direction indicated by arrow 120, the magnetization of the free layer is free to rotate in response to a magnetic field. As those skilled in the art will recognize, the relative directions of magnetization of the free 104 and pinned 102 layers affects the electrical resistance through the sensor. This resistance is greatest when the magnetization of the free layer 104 and the ferromagnetic layer 114 of the pinned layer 102 are antiparallel and is at a minimum when they are parallel. These magnetizations 120 and 114 are set to be perpendicular in the absence of a magnetic field, so that the signal sensed from relative movements about this quiescent state will be at its most linear relationship.

The magnetization of the free layer in a typical magnetoresistive sensor is biased by hard bias layers 122, 124, disposed at either lateral edge of the sensor. Electrically conductive leads 123, 125 disposed over the bias layers provide electrical sense current to the sensor 100 during use. First and second electrically insulating gaps 100, 129, insulate the sensor 100 from a pair of magnetic shields 131, 133.

A capping layer 135, such as Ta, can also be provided to prevent corrosion during subsequent manufacturing processes.

The bias layers 122, 124 are constructed of a hard magnetic material (ie. a material with a high coercivity), and are magnetized by placing them in a magnetic field. The amount of biasing achieved by the hard bias layers 122, 124 is critical in that if the free layer is too strongly biased, the sensor will not be sufficiently sensitive. In other words, it would require a very strong field to rotate the direction of magnetization 120 of the free layer. The sensor would therefore be useless. On the other hand, weak biasing of the free layer results in domain fluctuations in the free layer resulting excessive noise in the signal read from the sensor. This too renders the sensor useless.

With reference now to FIG. 2, the relationship between bias strength and sensor reliability can be understood more clearly. More specifically, the curve 202 illustrates the relationship between the head amplitude, ranging from 400 µV to 3000 µV, and the soft error rate. The strength of the bias field is inversely proportional to the amplitude level. Those skilled in the art will recognize that manufacturing processes and materials are not perfect and that actual bias strength as generated by a hard bias layer will vary from wafer to wafer and even from head to head within a given wafer. As the bias strength drops below an acceptable level such as for example, point 206, where the amplitude is high, the free layer will become unstable, such that heads in this range will be unusable. Conversely, as the bias strength increases, heads falling to the left of a given point 204 on the curve 202, where the amplitudes are low, will be unacceptable, because the free layer will be too insensitive and unable to detect fields.

Therefore, there is a strong felt need for reliable free layer biasing in a magnetoresistive sensor. Such biasing would preferably always, or nearly always maintain the bias field within an acceptable range, eliminating the need to scrap heads due to insensitivity or instability.

SUMMARY OF THE INVENTION

The present invention provides a mechanism for reliably biasing a free layer of a magnetoresistive sensor. The invention includes an electromagnet including a ferromagnetic yoke having terminations adjacent opposite ends of a free layer of the sensor. An electrical coil wrapped around a portion of the yoke can induce a magnetic field in the yoke to bias the free layer. The yoke is preferably formed of a soft ferromagnetic material, ie. one having a low coercivity.

The magnetic yoke can be formed as first and second ferromagnetic portions separated by an electrically insulating gap. Forming the yoke as separate first and second portions prevents the yoke from shunting current from one side of the sensor to the other. The yoke portions can be constructed of many soft magnetic materials such as NiFe, FeN, FeXN (X could be Al, Ta, Co, etc.), CoFe, Sendust, CZT, CZN, etc. A pair of electrically conductive leads for providing a sense current to the sensor can be formed on top of the yoke portions.

By controlling the amount of current flowing through the coil, the amount of magnetic bias can advantageously be controlled so that no sensor would have to be rejected for having an improper amount of bias.

The invention can also include first and second front magnetic layers that have portions abutting first and second sides of the sensor, and a third back ferromagnetic layer that is separated from the first and second front ferromagnetic layers by a dielectric layer. A coil can be formed to wrap around the third magnetic layer so as to magnetize the third magnetic layer. The first and second magnetic layer can be formed to have portions overlapping the third magnetic layer, while being electrically insulated therefrom. With this arrangement, the magnetization of the third layer will magnetize the first and second magnetic layer, thereby providing magnetic biasing of the sensor without current shunting.

BRIEF DESCRIPTION OF THE DRAWINGS

For a fuller understanding of the nature and advantages of this invention, as well as the preferred mode of use, reference should be made to the following detailed description read in conjunction with the accompanying drawings.

BEST MODE FOR CARRYING OUT THE INVENTION

The following description is the best embodiment presently contemplated for carrying out this invention. This description is made for the purpose of illustrating the general principles of this invention and is not meant to limit the inventive concepts claimed herein.

Figure 3:
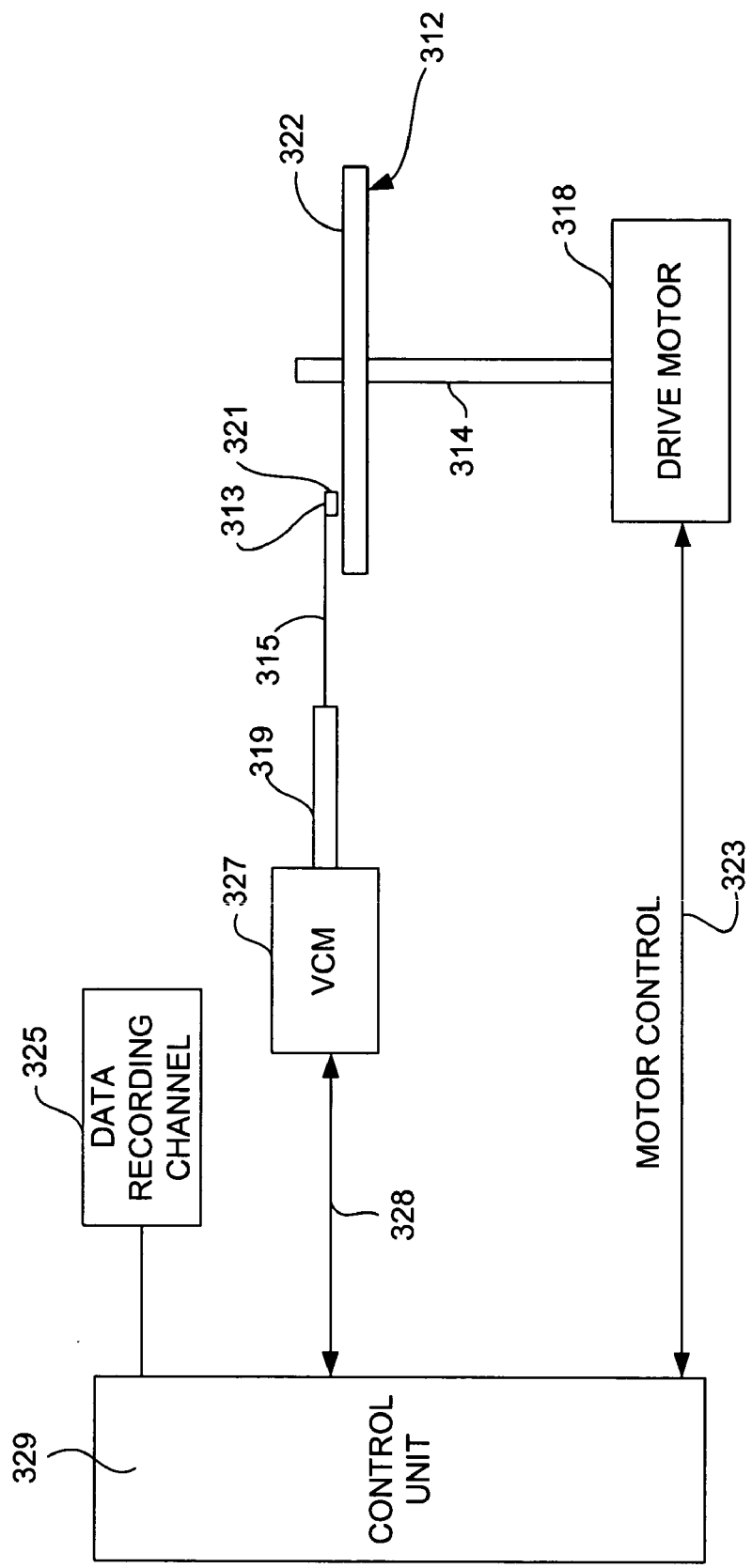
FIG. 3 is a schematic illustration of a magnetic recording system in which the present invention may be embodied.

Referring now to FIG. 3, there is shown a disk drive 300 embodying this invention. As shown in FIG. 3, at least one rotatable magnetic disk 312 is supported on a spindle 314 and rotated by a disk drive motor 318. The magnetic recording on each disk is in the form of an annular pattern of concentric data tracks (not shown) on the magnetic disk 312.

At least one slider 313 is positioned near the magnetic disk 312, each slider 313 supporting one or more magnetic head assemblies 321. As the magnetic disk rotates, slider 313 is moved radially in and out over the disk surface 322 so that the magnetic head assembly 321 may access different tracks of the magnetic disk where desired data are written. Each slider 313 is attached to an actuator arm 319 by way of a suspension 315. The suspension 315 provides a slight spring force which biases slider 313 against the disk surface 322. Each actuator arm 319 is attached to an actuator means 327. The actuator means 327 as shown in FIG. 3 may be a voice coil motor (VCM). The VCM comprises a coil movable within a fixed magnetic field, the direction and speed of the coil movements being controlled by the motor current signals supplied by controller 329.

During operation of the disk storage system, the rotation of the magnetic disk 312 generates an air bearing between the slider 313 and the disk surface 322 which exerts an upward force or lift on the slider. The air bearing thus counter-balances the slight spring force of suspension 315 and supports slider 313 off and slightly above the disk surface by a small, substantially constant spacing during normal operation.

The various components of the disk storage system are controlled in operation by control signals generated by control unit 329, such as access control signals and internal clock signals. Typically, the control unit 329 comprises logic control circuits, storage means and a microprocessor. The control unit 329 generates control signals to control various system operations such as drive motor control signals on line 323 and head position and seek control signals on line 328. The control signals on line 328 provide the desired current profiles to optimally move and position slider 313 to the desired data track on disk 312. Write and read signals are communicated to and from write and read heads 321 by way of recording channel 325.

The above description of a typical magnetic disk storage system, and the accompanying illustration of FIG. 3 are for representation purposes only. It should be apparent that disk storage systems may contain a large number of disks and actuators, and each actuator may support a number of sliders.

Figure 1:
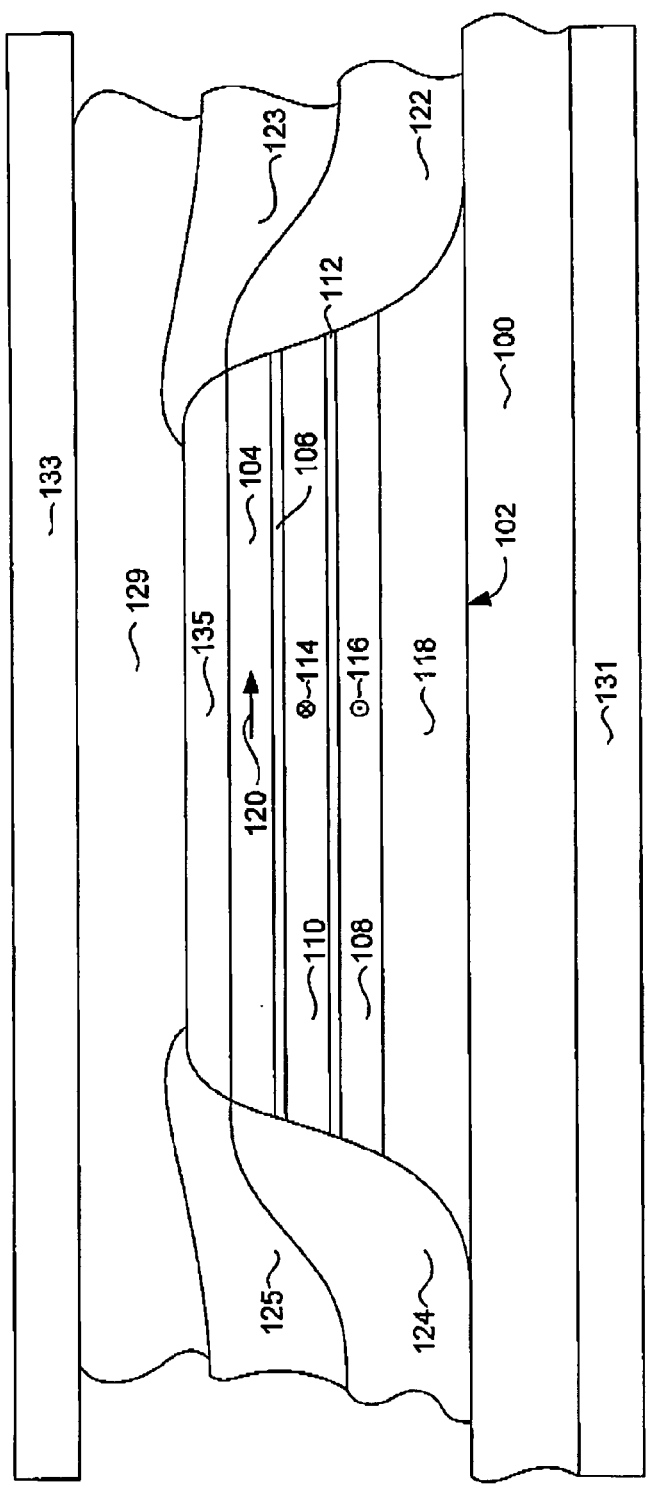
FIG. 1 is an ABS view of a prior art GMR sensor.
Figure 2:
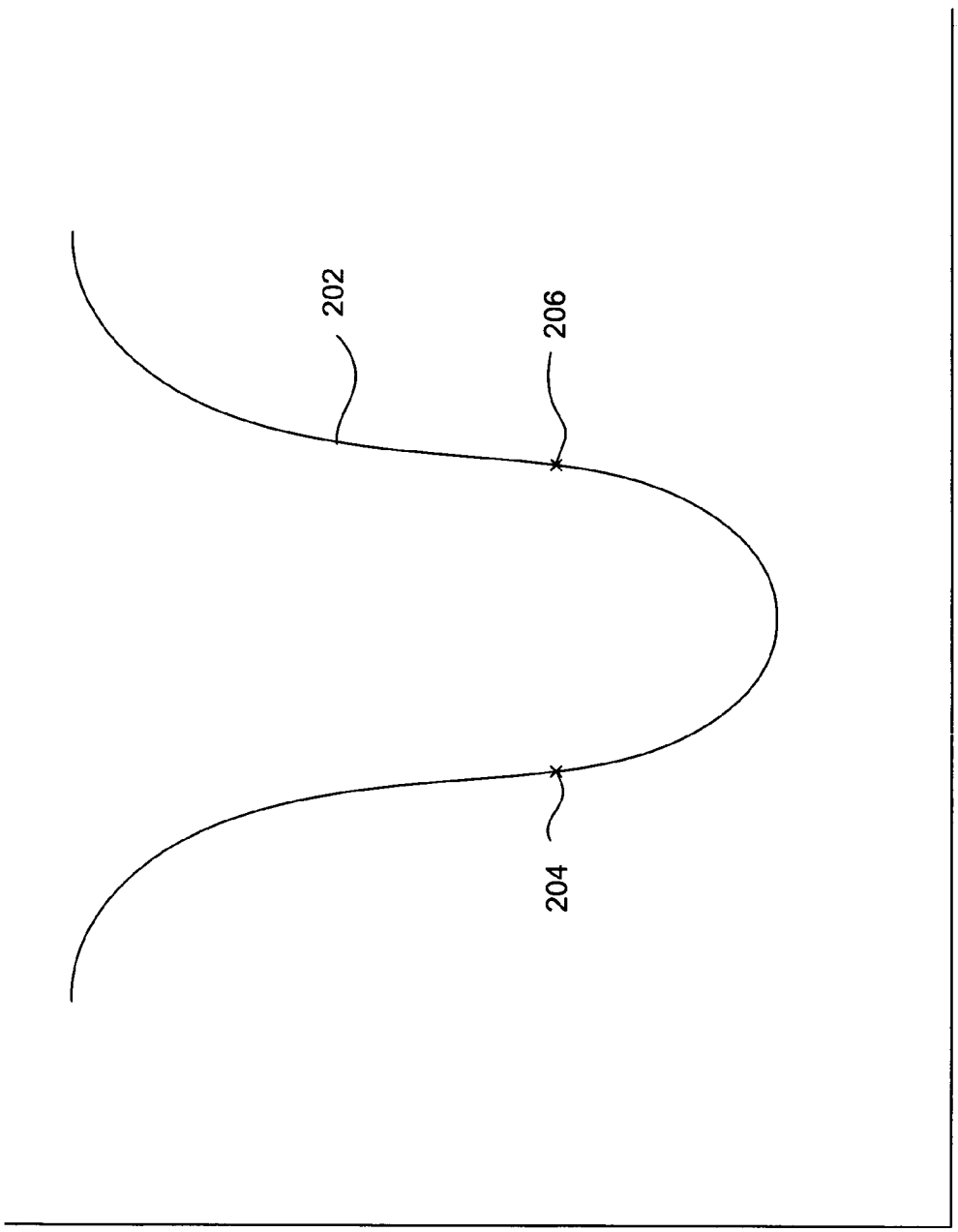
FIG. 2 is a graphical illustration of the relationship between soft error rate and bias strength.
Figure 4:
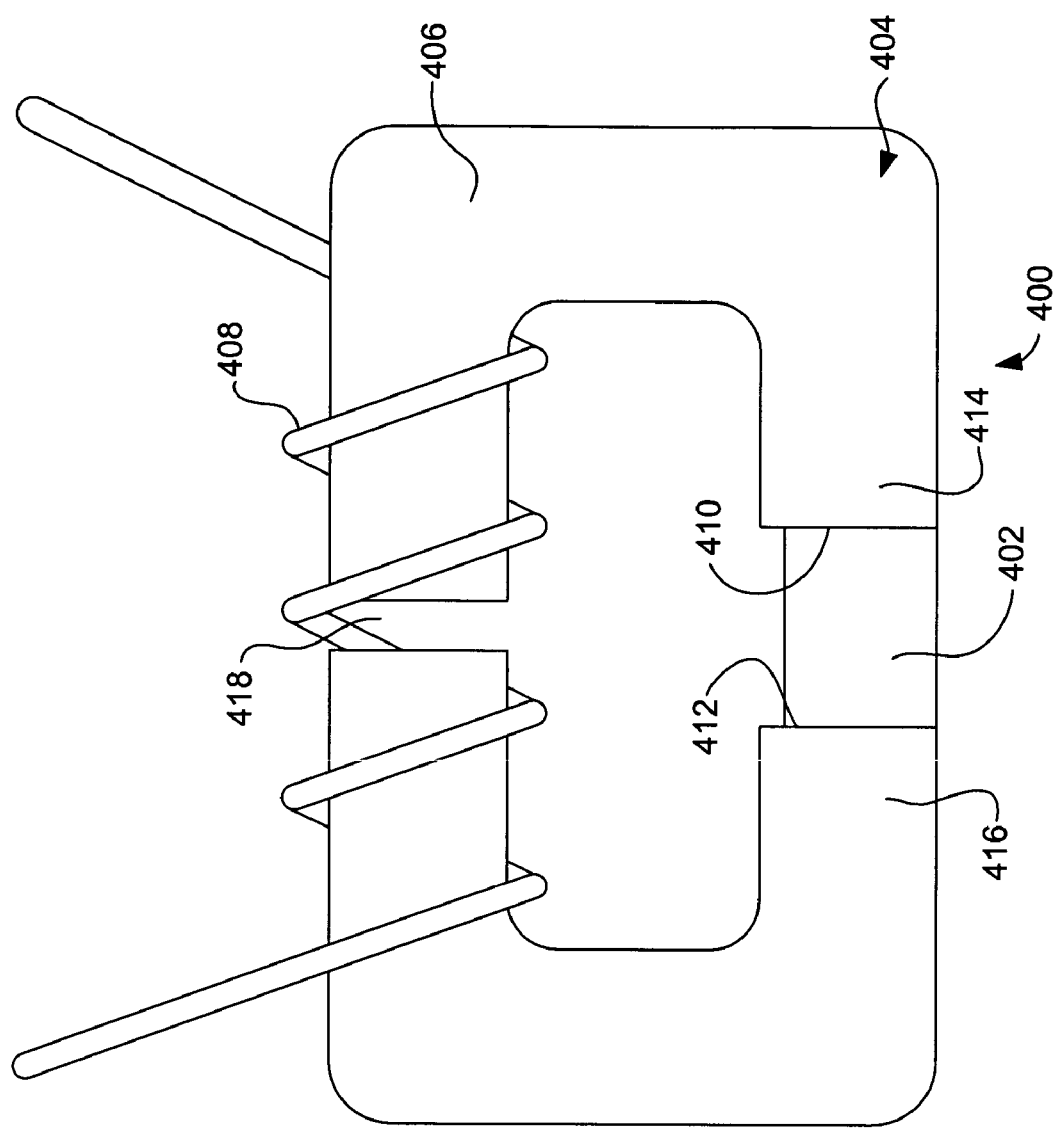
FIG. 4 is a schematic illustration of a mechanism for biasing a read head.

With reference to the schematic illustration of FIG. 4, the general concept of the invention can be understood. A read head 400, includes a magnetoresistive sensor 402, which can be similar to that described with reference to FIG. 1, or could be some other sensor in need of biasing. Biasing of the free layer 104 (FIG. 1) can be achieved by an electromagnetic biasing mechanism 404, which includes a soft magnetic yoke 406 and an electrically conductive coil 408. The yoke 406 has pole ends 410, 412 terminating at first and second lateral sides 414, 416 of the sensor 402 and, therefore, at laterally opposed ends of the free layer 104. The yoke 406 can also include a gap 418 to prevent the yoke from becoming a complete electrical circuit that would otherwise shunt current from the sensor. Other methods for preventing shunting are also possible, some of which will be described herein below and are contemplated by the present invention. The yoke 406 is preferably constructed of a soft magnetic material, ie. a material having a low coercivity. Such a material could be for example NiFe and could be deposited by electroplating. The coil 408 is constructed of an electrically conductive material, such as for example Cu or Au. The coil 408 is preferably formed to wrap around a portion of the yoke 406, but can be constructed in any manner that will induce a magnetic flux in the yoke 406, when an electrical current is caused to flow through the coil 408.

It will be appreciated by those skilled in the art that when an electrical current flows through the coil 408 a magnetic flux will be induced in the yoke 406, which will bias the magnetization of the free layer 104 of the sensor in a desired direction. The amount of biasing of the free layer 104 of the sensor 402 can be controlled by controlling the amount of current in the coil 408. The amount of current in the coil 408 can be controlled in situ by feedback circuitry incorporated into the control unit 329.

Figure 5:
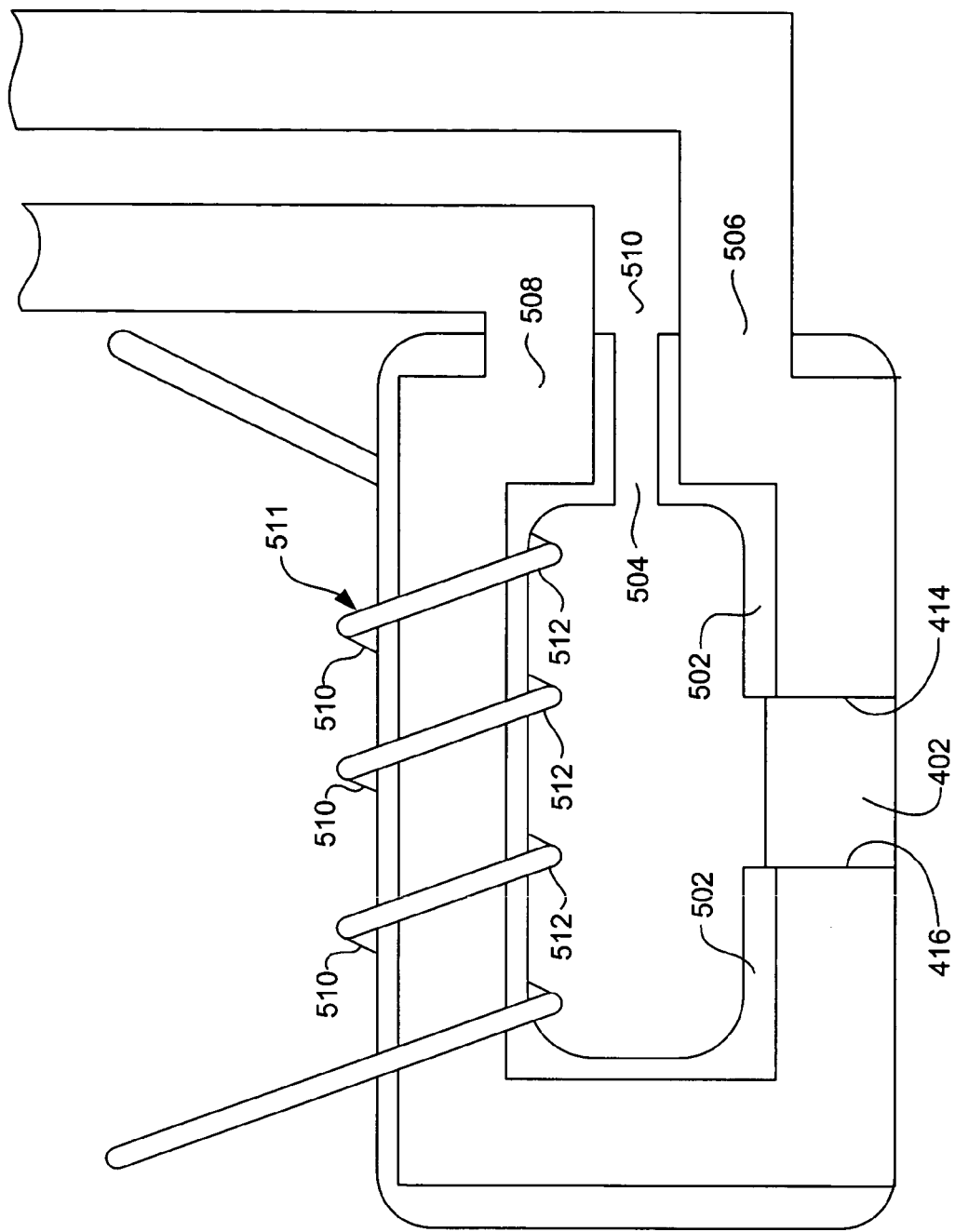
FIG. 5 is a simplified plan view of a possible embodiment of the present invention.

FIG. 5, illustrates a more detailed illustration of a possible embodiment of the present invention. The invention includes the sensor 402 having first and second laterally opposed sides 414, 416. A magnetic yoke 502 has termination points abutting the laterally opposed sides 414, 416, of the sensor 402 and has a gap 504 disposed to one side of the sensor. A pair of leads 506, 508 are disposed above the yoke 502, and can be in electrical contact with the yoke 502. The leads define a gap 510 formed therebetween, which is on the same side of the sensor as the gap 504 of the yoke 502. By placing the gap 510 of the leads 506, 508 at the same side as the gap 504 of the yoke 502, the yoke 502 can be in electrical contact with the leads 506, 508 without interfering with the function of the leads 506, 508 during use.

An electrically conductive coil is 511 constructed to wrap around the back portion of the yoke 502 which can be laterally elongated to more efficiently accommodate the coil. The coil can be formed of, for example, Cu or Au, and can be formed by plating a first set of generally parallel lines 510 of conductive material before construction of the yoke 502. After a construction of the yoke 502 and leads 506, 508, a second set of generally parallel, electrically conductive lines 512, the ends of which can be joined with ends of the first set 510 of electrically conductive lines by a vias formed therebetween. It should be appreciated that although, for purposes of clarity, only a few coil turns are illustrated in FIG. 5, there could actually be many more turns in the coil, the number being limited only by photolithographic manufacturing capabilities. The sets of lines 510, 512, are electrically isolated from the yoke 502, 508, by insulation layers, not shown.

Figure 6:
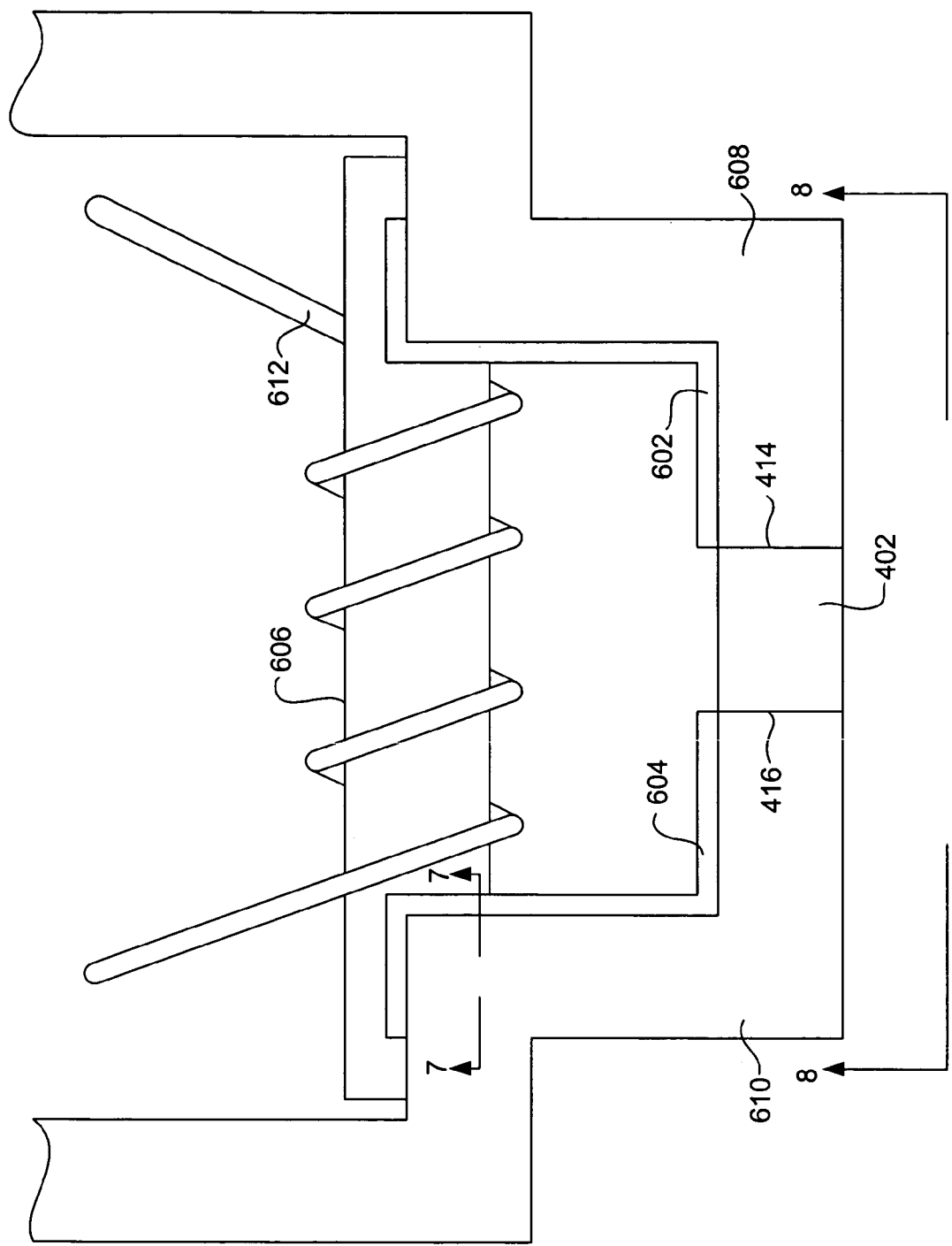
FIG. 6 is a simplified plan view of another possible embodiment of the present invention.
Figure 7:
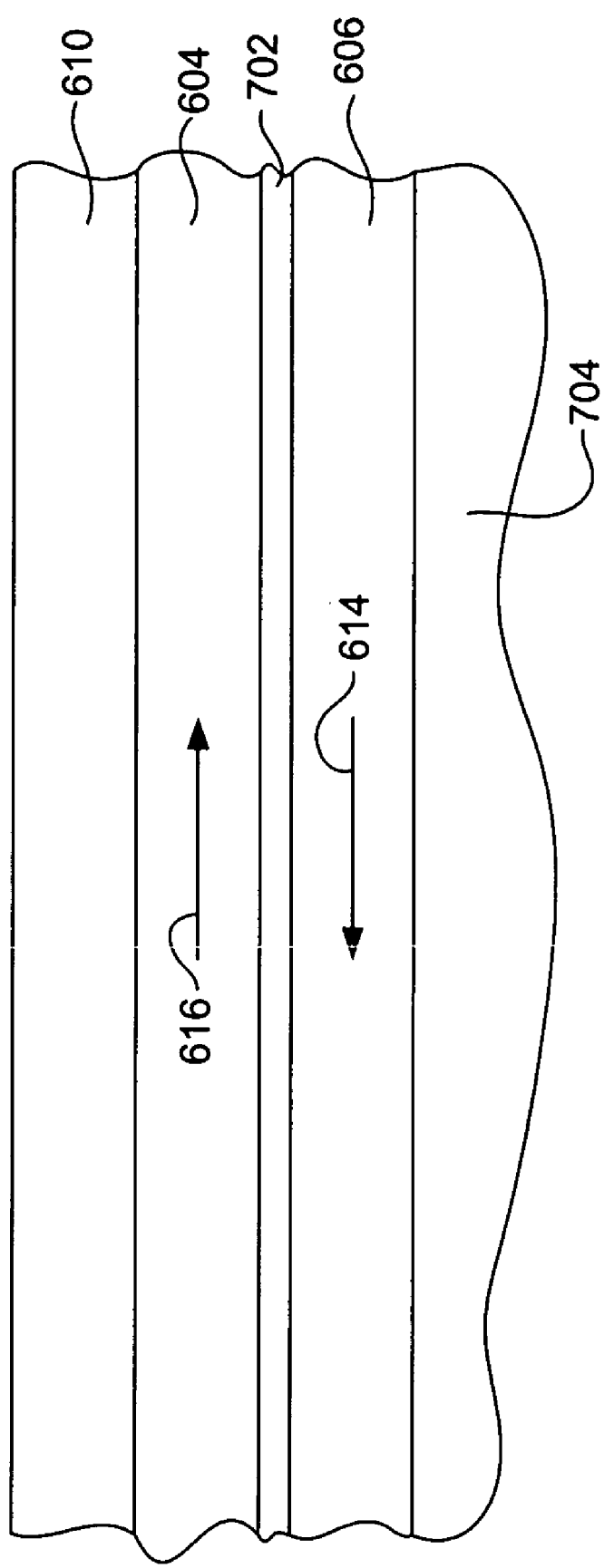
FIG. 7 is a sectional view taken from line 7—7 of FIG. 6 shown enlarged.
Figure 8:
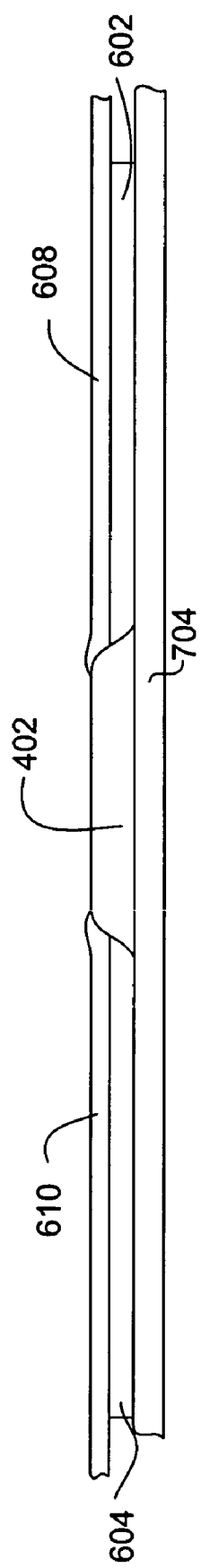
FIG. 8 is a view taken from line 8—8 of FIG. 6.

With reference now to FIGS. 6, 7 and 8, another embodiment of the invention includes first and second front soft bias layers 602, 604 and a back soft bias layer 606. These bias layers 602, 604, 606 can be constructed of a magnetic material and are preferably constructed of a soft magnetic material such as for example NiFe. The first and second front soft bias layers 602, 604 each have a distal end that overlap respective outer, laterally opposed end portions of the back soft bias layer 606. As can be seen with reference to FIG. 7, the front soft bias layer 604 is separated from the back soft bias layer in the overlapping region by an electrically insulating layer 702. Although the relationship between only one of the front soft bias layers 604 and the back soft bias layer 606 is depicted, it should be appreciated that the relationship between the other front soft bias layer 602 and the back soft bias layer 606 would be similar. Proximal ends of the front soft bias layers 602, 604 abut laterally opposed sides 414, 416 of the read sensor 402. The abutting junction of the soft bias layers 602, 604 with the sensor 402 can be seen with reference to FIG. 8. Electrically conductive leads 608, 610 can be formed above the front soft bias layers 602, 604 and can be in electrical contact therewith. The leads can be constructed of many electrically conductive materials such as Cu or Au and can be formed to contact the read sensor 604, in a manner similar to that described with reference to FIG. 8 or in some other manner that effectively introduces a sense current to the sensor 402 such as for example, a lead overlay design (not shown). The structure described is formed upon a dielectric substrate 704 such as alumina.

An electrically conductive coil 612 wraps around the back soft bias layer 606, such that an electrical current flowing through the coil 612, will magnetize the soft bias layer 606. The coil can be constructed in a manner similar to that described above with reference to FIG. 5.

It will be appreciated with continued reference to FIGS. 6, and 7 that when the coil 606 magnetizes the back soft bias layer 606, magnetostatic coupling between the back soft bias layer 606 and the front soft bias layers 602, 604 will cause the front soft bias layers 602, 604 to be magnetized in the same direction. While the front soft bias layers 602, 604 can become biased in this manner, the electrically insulating gap layer 702, prevents the front soft bias layers 608, 610, and back soft bias layer 606 from forming a complete electrical circuit, thereby preventing shunting of the sense current.

While various embodiments have been described above, it should be understood that they have been presented by way of example only, and not limitation. Other possible embodiments encompassed within the invention will be apparent to those skilled in the art. For example rather than providing a gap in the yoke described above, the magnetic yoke could be constructed of a soft magnetic, dielectric material such as MnZn-ferrite, NiZn-ferrite, etc. In addition, while the present invention has been described for use in a disk drive system, the present invention could be used in other applications, such as for example tape drive systems. Thus, the breadth and scope of a preferred embodiment should not be limited by any of the above-described exemplary embodiments, but should be defined only in accordance with the following claims and their equivalents.

What is claimed is:

1. A magnetic head comprising:
  a magnetoresistive sensor having first and second laterally opposed sides;
  a first front magnetic bias layer having a proximal end abutting said first side of said sensor and having a distal end;
  a second front magnetic bias layer having a proximal end abutting said second side of said sensor and having a distal end;
  a back magnetic bias layer having first and second ends;
  an electrically conductive coil formed about a portion of said back magnetic bias layer;
  a portion of said first front bias layer overlapping a portion of said back bias layer;
  a portion of said second bias layer overlapping a portion of said back bias layer; and
  said first and second front bias layers being electrically isolated from said back bias layer.

2. A magnetic head as in claim 1 wherein:
  said distal end of said first front bias layer overlaps said first end of said back bias layer; and
  said distal end of said second bias layer overlaps said second end of said back bias layer.

3. A magnetic head as in claim 2 further comprising;
  a dielectric layer disposed between said first bias layer and said first end of said back bias layer; and
  a dielectric layer disposed between said second bias layer and said second end of said back bias layer.

4. A magnetic head as in claim 3 wherein said dielectric layer formed between said first front bias layer and said first end of said back bias layer, and said dielectric layer formed between said second front bias layer and said second end of said back bias layer are each part of a contiguous bias layer.

5. A magnetic head as in claim 1 wherein said first and second front bias layers and said back bias layer are formed of a soft magnetic material.

6. A magnetic head as in claim 1 wherein said first and second front bias layers and said back bias layer are formed of NiFe.

* * * * *